(12) United States Patent
Alava et al.

(10) Patent No.: US 12,082,314 B2
(45) Date of Patent: Sep. 3, 2024

(54) METHOD FOR REGULATING A RESISTIVE ELEMENT INTENDED FOR DEICING AND/OR DEMISTING A SUPPORT, AND THE ASSOCIATED DEVICE

(71) Applicant: COMMISSARIAT A L'ENERGIE ATOMIQUE ET AUX ENERGIES ALTERNATIVES, Paris (FR)

(72) Inventors: Thomas Alava, Grenoble (FR); Zheng Han, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 587 days.

(21) Appl. No.: 17/073,575

(22) Filed: Oct. 19, 2020

(65) Prior Publication Data
US 2021/0127454 A1  Apr. 29, 2021

(30) Foreign Application Priority Data

Oct. 28, 2019  (FR) ...................................... 19 12031

(51) Int. Cl.
*H05B 1/02* (2006.01)
*A42B 3/24* (2006.01)
(Continued)

(52) U.S. Cl.
CPC ............ *H05B 1/0236* (2013.01); *B60S 1/026* (2013.01); *G05B 23/0221* (2013.01); *H05B 3/84* (2013.01);
(Continued)

(58) Field of Classification Search
CPC ..... A42B 3/245; B60S 1/026; G05B 23/0221; H01L 29/1606; H01L 29/24;
(Continued)

(56) References Cited

U.S. PATENT DOCUMENTS 3,902,040 A       8/1975  Ikeda et al.
4,782,216 A  *  11/1988  Woodard ............ C03C 17/3618
                                                                219/547
(Continued)

FOREIGN PATENT DOCUMENTS

CN       105539368 A    5/2016
DE     2 405 230 A1    8/1974
(Continued)

OTHER PUBLICATIONS

French Preliminary Search Report issued Jun. 30, 2020 in French Application 19 12031 filed on Oct. 28, 2019 (with English Translation of Categories of Cited Documents), 3 pages.

(Continued)

*Primary Examiner* — Dana Ross
*Assistant Examiner* — Joe E Mills, Jr.
(74) *Attorney, Agent, or Firm* — Oblon, McClelland, Maier & Neustadt, L.L.P.

(57) ABSTRACT

A method for regulating, with a computer, a resistive element arranged to deice and/or demist a support, the method including: a) a loop for monitoring the temperature T and the moisture level H at the support; b) a deicing and/or demisting sequence which, as long as the temperature T and the moisture level H monitored by the monitoring loop a) are indicative of an absence of frost or mist on the support, keeps the resistive element inactive and, in the contrary case, demands, in a step b2), the circulation of a current I in the resistive element so that the latter dissipates a thermal power $P_{th}$, adjusted according to the temperature T and the moisture level H, and providing deicing or demisting of the support over a predetermined period $D_p$.

13 Claims, 5 Drawing Sheets

(51) Int. Cl.
 *B60S 1/02* (2006.01)
 *G05B 23/02* (2006.01)
 *H01L 29/16* (2006.01)
 *H01L 29/24* (2006.01)
 *H01L 29/68* (2006.01)
 *H05B 3/84* (2006.01)

(52) U.S. Cl.
 CPC .......... *A42B 3/245* (2013.01); *H01L 29/1606* (2013.01); *H01L 29/24* (2013.01); *H01L 29/685* (2013.01); *H05B 2203/013* (2013.01); *H05B 2203/031* (2013.01)

(58) Field of Classification Search
 CPC .............. H01L 29/685; H05B 1/0236; H05B 2203/013; H05B 2203/031; H05B 3/84
 See application file for complete search history.

(56) References Cited

U.S. PATENT DOCUMENTS

| | | | |
|---|---|---|---|
| 6,470,696 | B1* | 10/2002 | Palfy ...................... G01N 25/56 62/3.4 |
| 8,431,869 | B2 | 4/2013 | Raghavan et al. |
| 2004/0149734 | A1* | 8/2004 | Petrenko .................. H05B 3/84 219/538 |
| 2012/0136627 | A1* | 5/2012 | Jensen ............... G05B 23/0221 702/182 |
| 2014/0021195 | A1 | 1/2014 | Kim et al. |
| 2014/0074351 | A1 | 3/2014 | Horbatt |
| 2019/0373681 | A1* | 12/2019 | Saad .................... H05B 1/0236 |
| 2020/0379027 | A1* | 12/2020 | Essawy ............. G01R 31/2829 |
| 2021/0190715 | A1* | 6/2021 | Francois ................ B64D 15/12 |

FOREIGN PATENT DOCUMENTS

| | | |
|---|---|---|
| DE | 10 2011 121 921 A1 | 6/2013 |
| EP | 3 013 119 A1 | 4/2016 |
| EP | 3 070 995 A1 | 9/2016 |
| KR | 10-2018-0088006 A | 8/2018 |
| WO | WO 2016/062885 A1 | 4/2016 |
| WO | WO 2018/210763 A1 | 11/2018 |

OTHER PUBLICATIONS

Kang et al., "High-Performance Graphene-Based Transparent Flexible Heaters", Nano Letters, 11, 2011, pp. 5154-5158.
Raji et al., "Composites of Graphene Nanoribbon Stacks and Epoxy for Joule Heating and Deicing of Surfaces", ACS Applied Materials & Interfaces, 8, 2016, pp. 3551-3556.
Kim et al., "Bright visible light emission from graphene", Letters, Nature Nanotechnology, vol. 10, Aug. 2015, pp. 676-682.
Davaji et al., "A patterned single layer graphene resistance temperature sensor", Scientific Reports, 7:8811, 2017, 10 pages.
U.S. Appl. No. 16/647,265, filed Mar. 13, 2020, 2020/0258783 A1, Alava, T, et al.

* cited by examiner

METHOD FOR REGULATING A RESISTIVE ELEMENT INTENDED FOR DEICING AND/OR DEMISTING A SUPPORT, AND THE ASSOCIATED DEVICE

TECHNICAL FIELD

The present invention relates to a method for regulating a resistive element intended to deice and/or demist a support, in particular the surface of a support, and more particularly the surface of a support that is transparent in the visible domain.

The present invention can be used for deicing a car window, in particular the front windscreen and/or the rear window thereof, or for deicing a visor of a mask or helmet.

The method according to the present invention provides in particular optimization of the energy consumption of the resistive element.

PRIOR ART

Deicing the rear window of a motor vehicle is generally provided by a resistive element. This resistive element may in particular comprise metal wires or strips (hereinafter "wires") parallel to each other over the entire length or width of the rear window.

In operation, the wires, when they have an electric current pass through them, dissipate a quantity of heat making it possible to melt frost liable to be present on at least one of the interior face or exterior face of the rear window.

Deicing systems for motor vehicles are generally controlled by an on/off switch, operated by the user (in particular the driver of the motor vehicle). In other words, starting up the deicing system requires an intentional action by the user both for switching it on and for switching it off.

This type of system is however not satisfactory.

This is because the intentional action of switching the deicing system on and off is performed on the basis of a subjective criterion that does not optimize the energy consumption thereof.

Moreover, it happens that the deicing system is left running simply because the driver forgets.

Moreover, a deicing system using wires partially obstructs the visibility of the driver so that the use thereof for deicing the (front) windscreen of a motor vehicle, or of a visor of a mask or helmet, cannot easily be envisaged.

In order to overcome these problems, and the least the problem relating to the visibility of the driver, it has been possible to envisage replacing the wires with a resistive element made from a conductive transparent oxide, and in particular indium tin oxide. However, the latter compound, although having suitable transparency, is still very fragile.

Moreover, the materials for manufacturing such oxides are not sufficiently abundant.

Producing the resistive element with carbon or silver nanowires woven in a 3-dimensional lattice also makes it possible to respond to the problem of transparency. However, mass production of resistive elements made from such nanowires cannot be envisaged at the present time.

The transparency properties of graphene, and mastery of the use thereof, makes of this material a candidate of choice for deicing systems.

In this regard, the documents [1], [2] and [3] cited at the end of the description disclose resistive elements made from graphene.

However, none of these documents addresses the problems associated with the optimization, and in particular the reduction, of the energy consumption of a deicing system.

One aim of the present invention is therefore to propose a method for regulating a deicing system, and the deicing system, making it possible better to control the energy consumption of said deicing system.

Another aim of the present invention is also to propose a method for regulating a deicing system, and a deicing system, making it possible to operate said system autonomously, and to objective criteria.

Another aim of the present invention is also to propose a method for regulating a deicing system.

DISCLOSURE OF THE INVENTION

The aims of the present invention are, at least in part, achieved by a method for regulating, by means of a computer, a resistive element arranged to deice and/or demist a support, the method comprising:

a) a loop for monitoring the temperature T and the moisture level H at the support;

b) a deicing and/or demisting sequence which, as long as the temperature T and the moisture level H monitored by the monitoring loop a) are indicative of an absence of frost or mist on the support, keeps the resistive element inactive and, in the contrary case, demands, in a step b2), the circulation of a current I in the resistive element so that the latter dissipates a thermal power $P_{th}$, adjusted according to the temperature T and the moisture level H, and providing deicing or demisting of the support over a predetermined period $D_p$, advantageously less than 2 seconds.

Thus the method according to the present invention makes it possible to control, according to objective criterion, and repeatably, the switching on and off of the resistive element.

The result is an optimization of the energy consumption, in particular in a motor vehicle wherein the only energy reserve is the battery.

According to one embodiment, the monitoring loop a) comprises:

a1) a step of measuring the temperature T and the humidity H;

a2) a step of determining the presence or not of frost or mist on the support according to the temperature T and the moisture level H measured at step a1).

According to one embodiment, the monitoring loop a) is executed periodically, advantageously every two seconds.

According to one embodiment, the deicing sequence b) comprises:

b1) a step of determining the thermal power $P_{th}$ on the basis of the temperature T and the moisture level H monitored by the loop a) performed before step b2).

According to one embodiment, step b1) is performed by means of a nomogram stored in a memory space of the computer, and making it possible to determine the thermal power $P_{th}$ according to the temperature T and the moisture level H.

According to one embodiment, the resistive element comprises a stack of layers formed by a first layer and a second layer separated by an insulating layer, the first layer comprising a two-dimensional material with resistance that is variable under the effect of an electrical field and is intended to dissipate the adjusted thermal power $P_{th}$, while the second layer comprises a resistive material and is intended, as soon as it is subjected to an electrical potential $V_g$, to impose an electrical field on the first layer.

According to one embodiment, the thicknesses of the first and second layers are adjusted so that the transparency of the resistive element in the visible domain is greater than 80%.

Thus the regulation method, and the resistive element, can be used on the front windscreen of a motor vehicle without interfering with the visibility of the driver.

According to one embodiment, the resistive material is also a two-dimensional material with resistance that is variable under the effect of an electrical field.

According to one embodiment, the deicing sequence b) also comprises a step b3), performed before step b1), of determining the resistance R of the first layer according to a potential Vg applied to the second layer.

According to one embodiment, the adjustment of the thermal power $P_{th}$ comprises an adjustment of the electrical potential $V_g$.

According to one embodiment, the resistive element is formed on an exposed face of the support.

According to one embodiment, the support comprises a stack of two layers, referred to as support layers, between which the resistive element is interposed According to one embodiment, the support is transparent in the visible domain, in particular the support comprises either a window of a motor vehicle, or a visor of a helmet, or a visor of a mask.

According to one embodiment, the monitoring loop a) is also executed by means of a temperature and humidity sensor disposed on or in the support.

The invention also relates to a computer program comprising instructions which, when the program is executed by a computer, lead the latter to implement the regulation method according to the present invention.

The invention also relates to a resistive element arranged to deice and/or demist a support, and controlled by a computer on which the computer program according to the present invention is stored.

According to one embodiment, the resistive element comprises a stack of layers formed by a first layer and a second layer separated by an insulating layer, the first layer comprising a two-dimensional material with resistance that is variable under the effect of an electrical field and is intended to dissipate the adjusted thermal power $P_{th}$, while the second layer comprises a resistive material and is intended, as soon as it is subjected to an electrical potential $V_g$, to impose an electrical field on the first layer.

According to one embodiment, the thicknesses of the first and second layers are adjusted so that the transparency of the resistive element in the visible domain is greater than 80%.

According to one embodiment, the resistive material is also a two-dimensional material with resistance that is variable under the effect of an electrical field.

BRIEF DESCRIPTION OF THE DRAWINGS

Other features and advantages will emerge in the following description of the method for regulating a resistive element according to the invention, given by way of non-limitative examples with reference to the accompanying drawings, wherein.

DETAILED DISCLOSURE OF PARTICULAR EMBODIMENTS

The present invention relates to a method for regulating a resistive element intended to deice and/or demist a support with which it is associated.

In particular, the regulation method is implemented by means of a computer that executes a loop for monitoring the temperature T and the moisture level of the support, and more particularly of a surface of said support.

The monitoring loop according to the present invention makes it possible in particular to detect, according to the temperature T and the moisture level H, the presence of frost and/or mist on the support.

The computer can also implement, as soon as the temperature T and the moisture level H indicate the presence of frost and/or humidity on the support, a deicing and/or demisting loop.

More particularly, according to the present invention, the deicing and/or demisting loop controls the resistive element so that the latter delivers a thermal power $P_{th}$ adjusted according to the temperature T and the moisture level H and providing the deicing or demisting of the support according to a predetermined period $D_p$, advantageously less than 2 seconds.

Figure 1:
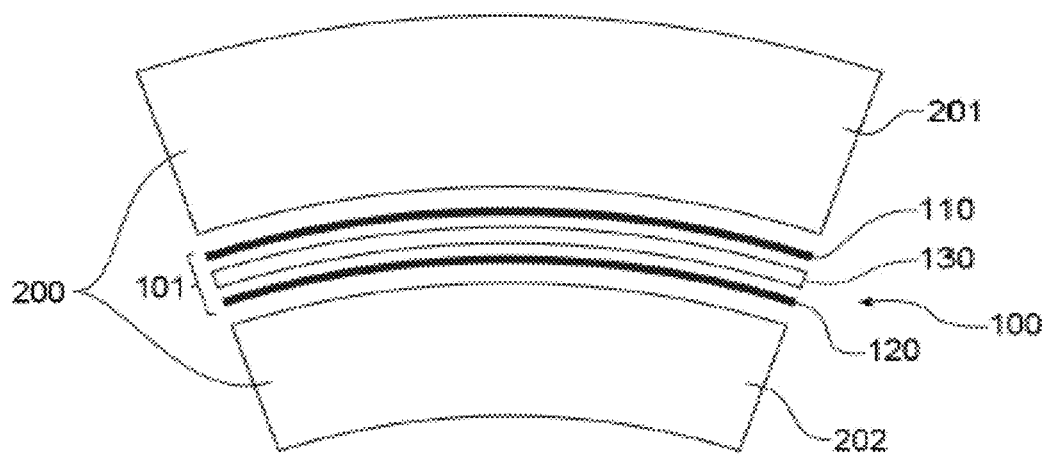
FIG. 1 is a schematic representation of a resistive element coupled to a support, and intended to be used in the present invention, the resistive element comprises in particular a stack of layers interposed between two support layers.

FIG. 1 is a schematic representation of a resistive element 100 able to be implemented in the context of the present invention.

The resistive element 100 according to the present invention is an element that, when it has an electric current I passing through it, dissipates a thermal power (and therefore heat) intended to deice and/or demist a support 200.

In this regard, the resistive element 100 may comprise metal wires disposed on an exposed face of the support 200.

Alternatively, the resistive element 100 may comprise a layer or a stack of layers that, according to a first variant, covers an exposed face of the support 200 and, according to a second variant, is in the volume of the support 200.

More particularly, according to the second variant, the support 200 comprises two layers, referred to as support layers 201 and 202, between which the resistive element is interposed.

The support 200 is advantageously transparent in the visible domain. "Transparent in the visible domain" means a coefficient of transmission greater than 80%, advantageously 90%, even more advantageously 95%, in the visible domain.

"Visible domain" means the range of wavelengths lying between 400 nm and 750 nm.

The support 200 may be rigid, and comprise for example glass or quartz.

Alternatively, the support 200 may be flexible and comprise a polyimide material, or polydimethylsiloxane, or polymethyl methacrylate (PMMA).

More particularly, the support 200 may be a visor of a mask or of a helmet, a window of a motor vehicle, for example a windscreen or a rear window.

According to an advantageous embodiment, the resistive element 100 comprises a stack of layers 101 formed by a first layer 110 and a second layer 120 separated by an insulating layer 130.

"Insulating layer" means a layer that is electrically insulating and which, consequently, guarantees electrical insulation between the first layer 110 and the second layer 120.

The insulating layer 130 may in particular comprise a dielectric material, for example a glass or silicon dioxide or hafnium oxide.

The thickness of the insulating layer may be between 100 nm and 100 µm.

The first layer 110 is advantageously a two-dimensional material. "Two-dimensional material" means a material that has a two-dimensional crystalline structure. Such materials in general comprise a stack of crystalline planes in which the atoms or molecules are connected by covalent bonds, while interactions of the van der Waals type provide cohesion between crystalline planes.

The two-dimensional material forming the first layer 110 also has electrical resistance that is variable according to an electrical field to which it is liable to be subjected.

In other words, it is possible to modulate the electrical resistance of the first layer 110 according to an electrical field imposed in the near environment thereof.

The materials able to meet the aforementioned two criteria are known to persons skilled in the art, and may comprise at least one of the elements chosen from: graphene, $MoS_2$, $MoSe_2$, $WS_2$ and $WSe_2$.

The thickness of the first layer 110 is adjusted by a person skilled in the art according to the properties of transparency that he wishes to confer thereon. For example, the first layer 110 may comprise between one and ten atomic layers of the two-dimensional material with variable resistance.

More particularly, the thicknesses of the first layer 110 and of the second layer 120 are adjusted so that the transparency of the resistive element 100 in the visible domain is greater than 80%, advantageously greater than 90%, even more advantageously greater than 95%.

The second layer 120 comprises a resistive material, for example a conductive transparent oxide, or a two-dimensional material with variable resistance.

A first layer 110 and a second layer 120 made from the same material is however preferable.

The second layer 120 is in particular arranged, when it is subjected to a given potential Vg (also referred to as "gate potential"), to impose an electrical field on the first layer 110.

In other words, the potential Vg imposed on the second layer makes it possible to vary the electrical resistance of the first layer 110.

Figure 2:
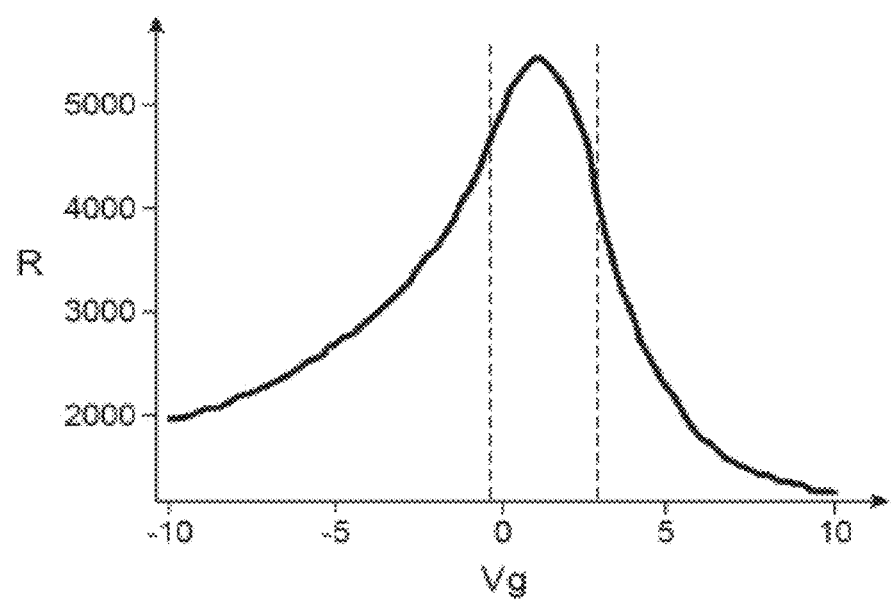
FIG. 2 is a graphical representation of the resistivity (vertical axis, R in ohms) of a first monolayer of graphene from a second monolayer of graphene by a dielectric material, as a function of a gate potential Vg (horizontal axis, Vg in volts) to which said second layer is subjected for a given temperature and moisture level.

In this regard, FIG. 2 is a graphical representation of the electrical resistance R of a first layer 110 made from graphene according to the gate potential Vg imposed on a second layer also made from graphene.

The electrical resistance of the first layer describes a bell curve and has a maximum.

Figure 3:
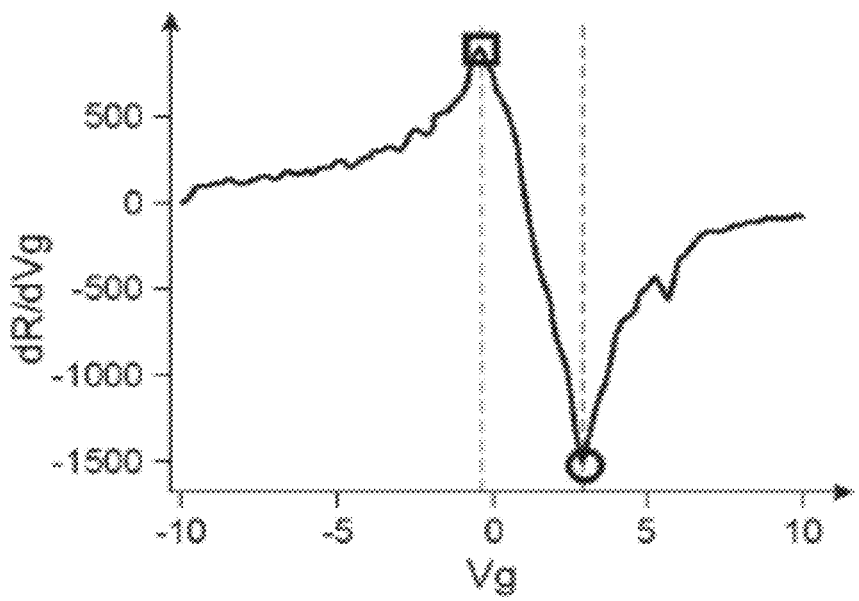
FIG. 3 is a graphical representation of the first derivative of the resistivity (vertical axis, dR/dVg) depicted in FIG. 2, as a function of the gate potential (horizontal axis, Vg)

This curve of change in the electrical resistance in bell shape also has two change-of-direction points revealed by the first derivative of the resistance as a function of the gate potential (FIG. 3).

The remainder of the description is limited to a resistive element that comprises a first layer and a second layer made from graphene and between which a layer of dielectric material such as silicon dioxide is interposed.

Figure 6:
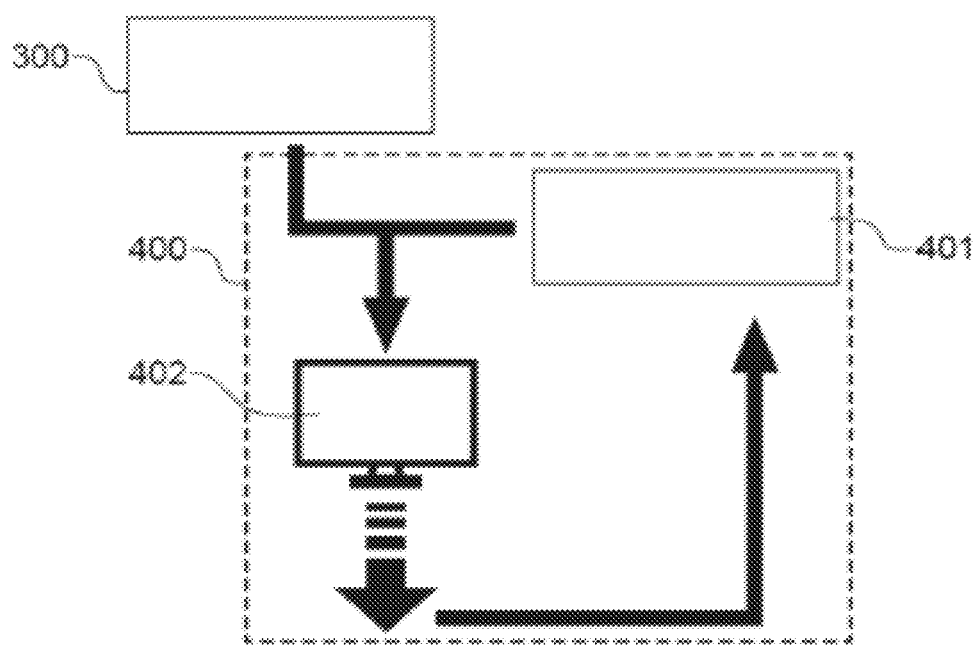
FIG. 6 is a schematic representation of the interfacing of the computer with the sensor or sensors and the resistive element.

The method (illustrated in FIG. 4) for regulating the resistive element 100 is executed by means of a computer 400 (FIG. 6).

"Computer" means a device provided with a processor capable of executing commands, and in particular the commands of a computer program stored for example in a dedicated memory space of said computer 400.

Figure 4:
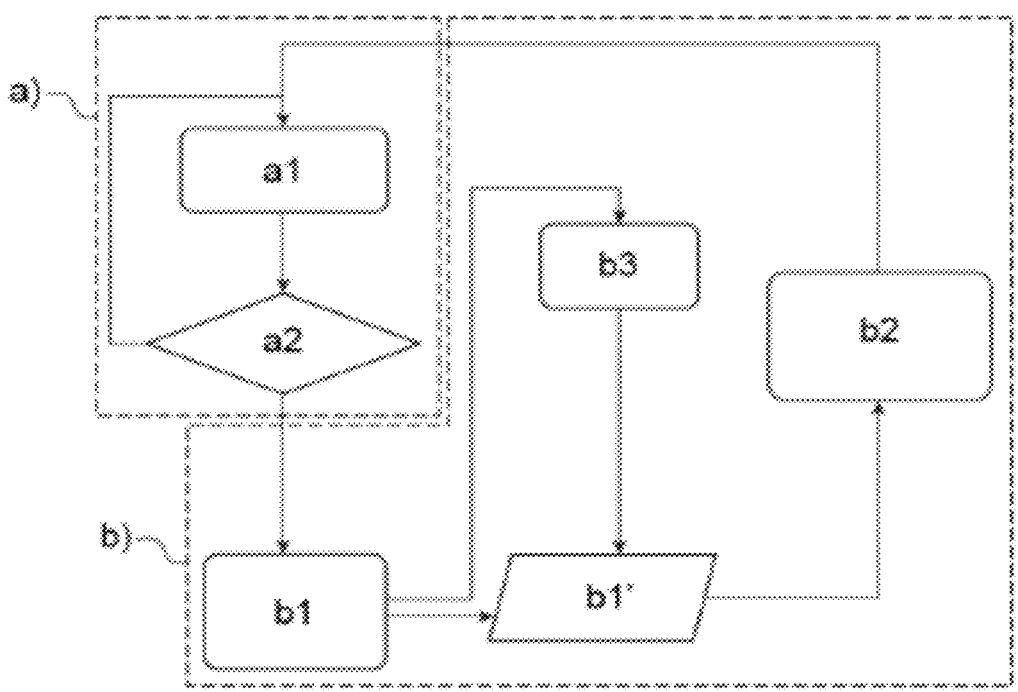
FIG. 4 is a schematic representation of the concatenation of the steps of the method for regulating the resistive element according to the present invention.

The method for regulating the resistive element, illustrated in FIG. 4, according to the present invention comprises a loop a) for monitoring the temperature T and the moisture level H at the support 200.

It is understood that a "loop" according to the terms of the present invention comprises one or more steps and is repeated, for example at regular time intervals. The execution of a loop may be subject to conditions.

The monitoring loop a) may be executed at regular time intervals (or periodically), for example every minute or every thirty seconds, or every five seconds.

The monitoring loop a) may comprise a step a1) of measuring the temperature T and the moisture level H.

The step a1) may be executed by means of one or more temperature and/or humidity sensors 300.

Figure 5:
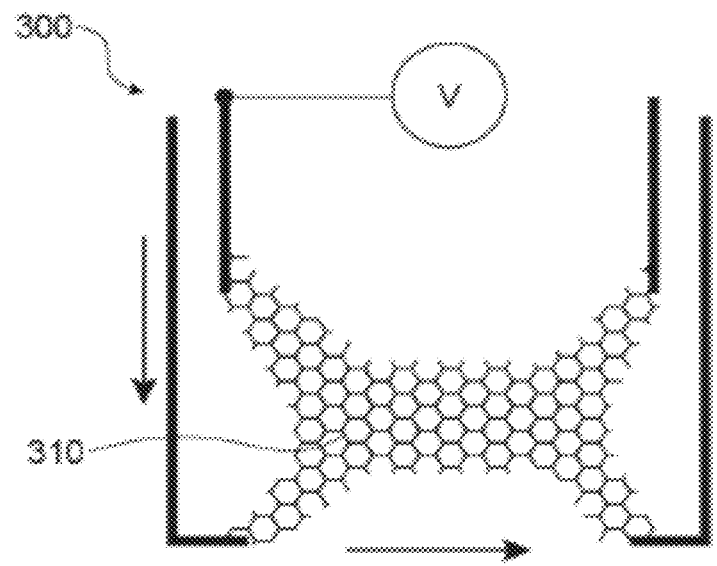
FIG. 5 is a schematic representation of a temperature sensor made from graphene and able to be used to determine the temperature of the support during the execution of the method for regulating the resistive element.

By way of example, FIG. 5 shows a sensor 300, in particular a temperature sensor.

This sensor 300 comprises in particular a monolayer of graphene 310. The temperature dependence of the electrical resistance of the graphene makes thereof a material of choice for use in a temperature sensor.

The determination of temperature with such a sensor 300 comprises a measurement of the electrical voltage V between two terminals formed on the graphene when the latter has an electric current of a known intensity I passing through it.

The document [4] cited at the end of the description describes an example of such a temperature sensor able to be used in the context of the present invention.

The sensor 300 may be disposed on or in the support 200, and thus allow a faithful estimation of the temperature T and/or of the moisture level H of said support 200.

The monitoring loop a) may also comprise a step a2) of determining the presence or not of frost and/or mist on the support according to the temperature T and the moisture level H measured on the support 200 during step a1).

The regulation method also comprises a deicing and/or demisting sequence b).

In particular, as soon as the temperature T and the moisture level H monitored at step a) are indicative of the presence of frost and/or mist, the sequence b), in a step b2), demands the injection of an electric current I into the resistive element 100 so that the latter dissipates a thermal power $P_{th}$, adjusted according to the temperature T and the moisture level H, and affording deicing or demisting of the support during the predetermined period $D_p$.

The predetermined period is advantageously less than twenty seconds, even more advantageously less than five seconds, and preferably less than two seconds.

It is understood, without its being necessary to state it, that the resistive element 100 is associated with a source of current. The latter may for example be integrated in the computer 400.

In the absence of frost and/or mist, the sequence b) leaves the resistive element 100 inactive. In other words, no electric current circulates in the resistive element 100.

It is therefore understood that entering the deicing and/or demisting sequence is dependent on the presence of frost and/or mist on the support, and that the method for regulating the resistive element leaves said sequence as soon as the temperature T and the moisture level H on the support are no longer indicative of the presence of frost and/or mist on said support.

The electric current I, in the context of the stack of layers in question, circulates in the first layer 110.

The adjustment of the thermal power $P_{th}$ (step b1), FIG. 4), advantageously comprises an adjustment of the gate potential Vg (step b1'), FIG. 4), imposed on the second layer 120. More particularly, the gate potential Vg is adjusted so that the first layer 110 has an electrical resistance $R_{th}$ to the passage of the electric current I allowing dissipation of the thermal power $P_{th}$ during the predetermined period $D_p$.

In other words, use of a first layer comprising a two-dimensional material with variable resistance makes it possible to consider a fixed source of electric current.

The determination of the thermal power $P_{th}$ can be executed on the basis of a numerical simulation or ab initio calculations that are within the capability of a person skilled in the art.

Alternatively, determination of the thermal power $P_{th}$ may use a calibration curve or a nomogram stored in a memory space of the computer 400.

The nomogram in question makes it possible to determine, from the temperature T or from the moisture level H, the thermal power $P_{th}$ necessary for melting the frost or for evaporating the mist liable to have formed on the support.

This nomogram can in particular be constructed experimentally.

The construction of the nomogram may comprise the determination of the thermal power $P_{th}$ necessary for melting the frost or for evaporating the mist liable to have formed on the support at a given temperature T or moisture level H.

In particular, the determination of the thermal power $P_{th}$ may comprise the measurement of the time required for melting frost or evaporating mist when the first layer 110 has a current I passing through it.

This step may comprise a simple observation of the complete disappearance of the frost or mist, and concludes with a measurement of the temperature T and of the moisture level of the support 200.

This protocol may be repeated as many times as necessary and for various pairs of temperature T and moisture level H.

Figure 7:
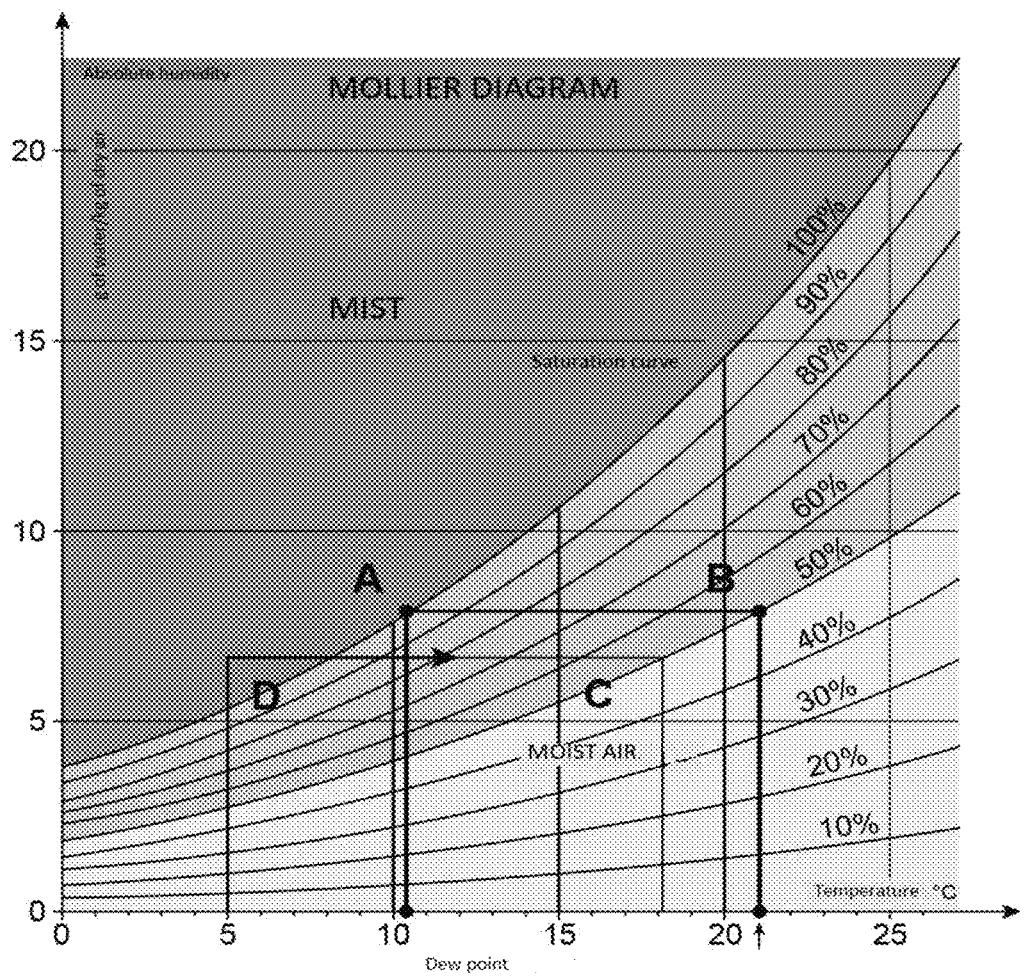
FIG. 7 is a graphical representation of the Mollier diagram relating to the change in liquid and water-vapor state.
Figure 8A:
FIGS. 8a, 8b, 8c, 8d, 8e are schematic representations of a method for manufacturing a resistive element able to be used in the context of the present invention.
Figure 8B:
Figure 8C:
Figure 8D:
Figure 8E:
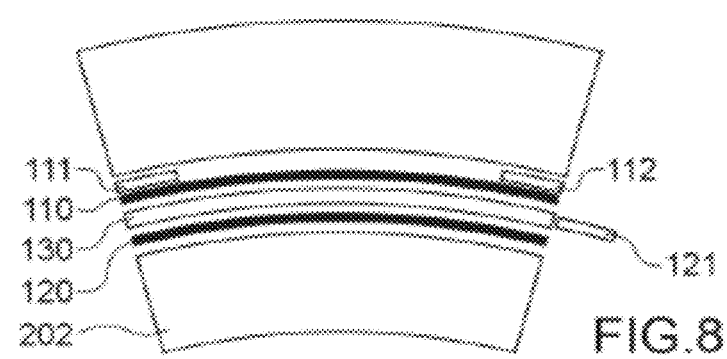

By way of example, the Mollier diagram shown in FIG. 7 may be considered. This diagram is a graphical representation of the changes in liquid gaseous state of the water on a surface as a function of the temperature (in ° C. on the horizontal axis) and the absolute humidity level (in g of water/kg of dry air on the vertical axis).

At the point B of this diagram, the temperature and the humidity define a saturation of gaseous water in the air of 50%. Thus, if for a constant absolute humidity level the temperature decreases, for example to the temperature defined by the point A, a phenomenon of condensation of the water occurs, and liquid water forms on the surface in question (it is a case of the dew point).

Now it is a case of demisting the surface in question subjected for example to conditions of temperature and absolute humidity associated with the point D on the Mollier diagram, it may be arbitrarily chosen by a person skilled in the art to determine the thermal power $P_{th}$ making it possible to heat the surface in question to a temperature corresponding to a moisture level in air equal to 50%. In other words, as shown on the Mollier diagram in FIG. 7, it may be considered to determine the thermal power necessary for heating the surface to the temperature associated with the point C.

Under these conditions, the power $P_{th}$ necessary for demisting can be determined as follows:

imposing a gate voltage Vg on the second layer 120 so that the first layer 110 has an electrical resistance $R_{th}$ to the passage of the electric current, applying a fixed current and noting a time $t_c$ as from which the mist on the surface in question disappears.

The time $t_c$, the electrical resistance $R_{th}$ and the fixed current then make it possible to determine the power $P_{th}$ required for demisting the surface under particular temperature and moisture conditions.

These operations can be repeated as many times as necessary for determining the power necessary for demisting for various temperature and absolute humidity pairs.

The procedure described above then makes it possible to construct the following nomogram:

It is however notable that the values given in the following table are established with regard to an arbitrary choice of humidity of the air. The values represent a trend from one box to another, and modifying the criteria relating to humidity for constructing another nomogram.

|  | Humidity of the air | | | | | | | | | |
|---|---|---|---|---|---|---|---|---|---|---|
| Initial surface | 50% | | 60% | | 70% | | 80% | | 90% | |
| temperature | $P_{th}$ (W) | $t_c$ (s) | $P_{th}$ (W) | $t_c$ (s) | $P_{th}$ (W) | $t_c$ (s) | $P_{th}$ (W) | $t_c$ (s) | $P_{th}$ (W) | $t_c$ (s) |
| 5° C. | 0.01 | 80 | 0.01 | 90 | 0.01 | 105 | 0.01 | 125 | 0.01 | 140 |
|  | 0.1 | 9.5 | 0.1 | 11.5 | 0.1 | 15 | 0.1 | 20 | 0.1 | 28 |
|  | 1 | 3 | 1 | 6 | 1 | 9 | 1 | 11 | 1 | 13 |
|  | 10 | 1 | 10 | 1.5 | 10 | 2.5 | 10 | 3.5 | 10 | 5 |
| 7.5° C. | 0.01 | 70 | 0.01 | 80 | 0.01 | 90 | 0.01 | 105 | 0.01 | 125 |
|  | 0.1 | 9 | 0.1 | 9.5 | 0.1 | 11.5 | 0.1 | 15 | 0.1 | 20 |
|  | 1 | 2.5 | 1 | 3 | 1 | 6 | 1 | 9 | 1 | 11 |
|  | 10 | 0.8 | 10 | 1 | 10 | 1.5 | 10 | 2.5 | 10 | 3.5 |
| 10° C. | 0.01 | 60 | 0.01 | 70 | 0.01 | 80 | 0.01 | 90 | 0.01 | 105 |
|  | 0.1 | 8 | 0.1 | 9 | 0.1 | 9.5 | 0.1 | 11.5 | 0.1 | 15 |

-continued

| Initial surface | Humidity of the air | | | | | | | | | |
|---|---|---|---|---|---|---|---|---|---|---|
| | 50% | | 60% | | 70% | | 80% | | 90% | |
| temperature | $P_{th}$ (W) | $t_c$ (s) | $P_{th}$ (W) | $t_c$ (s) | $P_{th}$ (W) | $t_c$ (s) | $P_{th}$ (W) | $t_c$ (s) | $P_{th}$ (W) | $t_c$ (s) |
| | 1 | 2 | 1 | 2.5 | 1 | 3 | 1 | 6 | 1 | 9 |
| | 10 | 0.5 | 10 | 0.8 | 10 | 1 | 10 | 1.5 | 10 | 2.5 |
| 12.5° C. | 0.01 | 45 | 0.01 | 60 | 0.01 | 70 | 0.01 | 80 | 0.01 | 90 |
| | 0.1 | 6.5 | 0.1 | 8 | 0.1 | 9 | 0.1 | 9.5 | 0.1 | 11.5 |
| | 1 | 1.2 | 1 | 2 | 1 | 2.5 | 1 | 3 | 1 | 6 |
| | 10 | 0.35 | 10 | 0.5 | 10 | 0.8 | 10 | 1 | 10 | 1.5 |
| 15° C. | 0.01 | 35 | 0.01 | 45 | 0.01 | 60 | 0.01 | 70 | 0.01 | 80 |
| | 0.1 | 5 | 0.1 | 6.5 | 0.1 | 8 | 0.1 | 9 | 0.1 | 9.5 |
| | 1 | 0.8 | 1 | 1.2 | 1 | 2 | 1 | 2.5 | 1 | 3 |
| | 10 | 0.35 | 10 | 0.35 | 10 | 0.5 | 10 | 0.8 | 10 | 1 |

The regulation method according to the present invention therefore makes it possible to optimize the thermal power necessary for deicing and demisting a support 200.

The switching on and off of the resistive element according to any formation of frost or mist on the support is executed automatically on objective and repeatable criteria, and therefore no longer require action by an operator.

The consideration of a first transparent layer 110 and of a second transparent layer 120 makes it possible to envisage the use of the resistive element according to the present invention also for the deicing of a windscreen of a motor vehicle, or of a visor of a mask or helmet.

The deicing sequence b) may also comprise a step b3) of determining the electrical resistance R of the first layer 110 according to the gate potential Vg able to be applied to the second layer 120.

In particular, the step b3) comprises an acquisition, by the computer 400, of the voltage V at two terminals of the first layer through which a known electric current I passes, and for various gate potential values Vg.

The present invention also relates to a computer program which, when it is executed by a computer 400, leads the latter to implement the method for regulating the resistive element 100.

The present invention also relates to the resistive element for deicing and/or demisting a support, and controlled by the computer 400 on which the computer program is stored.

In particular, the resistive element comprises the stack of layers 101 formed by the first layer 110 and the second layer 120 separated by the insulating layer 130.

The first layer may comprise a two-dimensional material with a resistance that is variable under the effect of an electrical field and is intended to dissipate the adjusted thermal power $P_{th}$, while the second layer may comprise a resistive material and is intended, as soon as it is subjected to an electrical potential $V_g$, to impose an electrical field on the first layer.

Moreover, the thicknesses of the first 110 and second layer 120 can be adjusted so that the transparency of the resistive element in the visible domain is greater than 80%.

Furthermore, the resistive material may also comprise a two-dimensional material with resistance that is variable under the effect of an electrical field.

According to a first variant, the resistive element is formed on an exposed face of the support.

According to a second variant, the support comprises two layers, referred to as support layers, between which the resistive element is interposed.

Finally, the support may be transparent in the visible domain, in particular the support may comprise either a window of a motor vehicle, or a visor of a helmet, or a visor of a mask.

FIGS. 8a to 8e show an example of a method for manufacturing the resistive element in a support 200 provided with two support layers 201 and 202. The support 200 is in particular a windscreen.

The method comprises a first step 1) of forming the second layer 120 on one of the support layers, for example the support layer 202.

The second layer may comprise graphene by dispersion (spray coating).

The first step 1) is followed by a second step 2) of forming the insulating layer 130. The insulating layer 130 may comprise $SiO_2$ or $HfO_2$ and be formed by a technique of vapor deposition (CVD or chemical vapor deposition).

A third step 3) of forming the first layer 110 by covering the insulating layer 130 is next performed in accordance with the same methods as the first step.

Source 111 and drain 112 contacts on the one hand, and gate contacts 121 on the other hand, are formed respectively on the first layer 110 and on the second layer 120 in a fourth step 4).

The step 4) is then followed by a fifth step 5) of covering the first layer 110 with the support layer 201.

In addition, one or more temperature and/or moisture level sensors may be formed on the support.

The resistive element 100, and optionally the sensor or sensors 300, may be interfaced with the computer 400.

The computer 400 may in particular comprise an execution unit 401, intended to implement the sequence b), and a data processing unit 402 intended to collect the temperature and the moisture level measured by the sensor or sensors 300, and to determine the conditions for implementing the deicing and/or demisting sequence.

REFERENCES

[1] US 2014/0021195,
[2] WO 2016062885,
[3] U.S. Pat. No. 8,431,869,
[4] Davaji B et al., "*A patterned single layer graphene resistance temperature sensor*", Scientific Reports 7, 8811 (2017).

The invention claimed is:

1. A method for regulating, with a computer, a resistive element arranged to deice and/or demist a support, wherein the resistive element comprises a stack of layers formed by a first layer and a second layer separated by an insulating layer, the first layer comprising a two-dimensional material with resistance that is variable under an effect of an electrical field and is configured to dissipate adjusted thermal power while the second layer comprises a resistive material and is configured, as soon as the resistive material is subjected to an electrical potential, to impose an electrical field on the first layer, the method comprising:

monitoring, with a monitoring loop, temperature T and moisture level H at the support, keeping the resistive element inactive, through a deicing and/or demisting sequence as long as the temperature T and the moisture level II monitored during the monitoring loop are indicative of an absence of frost or mist on the support, demanding, when the temperature T and the moisture level H monitored during the monitoring loop are not indicative of an absence of frost or mist on the support, a circulation of a current in the resistive element so that the latter dissipates the thermal power adjusted according to the temperature T and the moisture level H, and allowing deicing or demisting of the support over a predetermined period, wherein the deicing sequence comprises a step, executed before determining the thermal power, of determining the resistance of the first layer as a function of a potential applied to the second layer.

2. The method according to claim 1, wherein the monitoring loop comprises:

a step of measuring the temperature T and the moisture level H, and a step of determining presence or not of frost or mist on the support according to the temperature T and the moisture level H.

3. The method according to claim 1, wherein the monitoring loop is executed periodically.

4. The method according to claim 1, wherein the deicing sequence comprises:

a step of determining the thermal power on the basis of the temperature T and the moisture level H.

5. The method according to claim 4, wherein determining the thermal power is performed with a nomogram stored in a memory space of the computer, and wherein determining the thermal power is performed by determining the thermal power as a function of the temperature T and the moisture level H.

6. The method according to claim 1, wherein the thermal power is adjusted by adjusting the electrical potential.

7. The method according to claim 1, wherein the monitoring loop is executed with a temperature and moisture sensor disposed on or in the support.

8. A computer program stored on a non-transitory medium, said computer program comprising instructions which, when the program is executed by a computer, instruct the computer to implement a method for regulating a resistive element arranged to deice and/or demist a support, comprising:

monitoring, with a monitoring loop, temperature T and moisture level H at the support;

keeping the resistive element inactive, through a deicing and/or demisting sequence as long as temperature T and moisture level H monitored during the monitoring loop are indicative of an absence of frost or mist on the support, and, demanding, when the temperature T and the moisture level H monitored during the monitoring loop are not indicative of an absence of frost or mist on the support, a circulation of a current in the resistive element so that the latter dissipates a thermal power adjusted according to the temperature T and the moisture level H, and allowing deicing or demisting of the support over a predetermined period.

9. A device comprising a resistive element arranged to deice and/or demist a support, and a computer on which the computer program according to claim 8 is stored, said computer being configured to regulate the resistive element.

10. The device according to claim 9, wherein the resistive element comprises a stack of layers formed by a first layer and a second layer separated by an insulating layer, the first layer comprising a two-dimensional material with resistance that is variable under the effect of an electrical field and is intended to dissipate the adjusted thermal power, while the second layer comprises a resistive material and is configured, as soon as the resistive material is subjected to an electrical potential, to impose an electrical field on the first layer.

11. The device according to claim 10, wherein thicknesses of the first and second layer are adjusted so that transparency of the resistive element in the visible domain is greater than 80%.

12. The device according to claim 10, wherein the resistive material is also a two-dimensional material with resistance that is under the effect of an electrical field.

13. A method for regulating, with a computer, a resistive element arranged to deice and/or demist a support, the method comprising:

monitoring, with a monitoring loop, temperature T and moisture level H at the support, keeping the resistive element inactive, through a deicing and/or demisting sequence as long as temperature T and moisture level monitored during the monitoring loop are indicative of an absence of frost or mist on the support, demanding, when the temperature T and the moisture level H monitored during the monitoring loop are not indicative of an absence of frost or mist on the support, a circulation of a current in the resistive element so that the latter dissipates a thermal power adjusted according to the temperature T and the moisture level H, and allowing deicing or demisting of the support over a predetermined period wherein the deicing sequence comprises a step of determining the thermal power on the basis of the temperature T and the moisture level H, wherein determining the thermal power is performed with a nomogram stored in a memory space of the computer, and wherein determining the thermal power is performed by determining the thermal power as a function of the temperature T and the moisture level H.

* * * * *